United States Patent [19]
Rottinghaus

[11] Patent Number: 5,207,491
[45] Date of Patent: May 4, 1993

[54] FAST-SWITCHING FREQUENCY SYNTHESIZER

[75] Inventor: Alan P. Rottinghaus, Lake Zurich, Ill.

[73] Assignee: Motorola Inc., Schaumburg, Ill.

[21] Appl. No.: 864,705

[22] Filed: Apr. 7, 1992

Related U.S. Application Data

[63] Continuation-in-part of Ser. No. 648,705, Jan. 31, 1991, abandoned.

[51] Int. Cl.⁵ .................... H03L 7/187; H03L 7/189
[52] U.S. Cl. .................................. 331/16; 331/1 A; 331/17; 455/260
[58] Field of Search .................. 331/15, 16, 17, 23, 331/1 A; 455/260

[56] References Cited

U.S. PATENT DOCUMENTS

| | | | |
|---|---|---|---|
| 4,006,429 | 2/1977 | Talbot | 331/14 |
| 4,105,948 | 8/1978 | Wolkstein | 331/14 |
| 4,410,860 | 10/1983 | Kipp et al. | 331/1 A |
| 4,511,858 | 4/1985 | Charavit | 331/10 |
| 4,634,998 | 1/1987 | Crawford | 331/1 A |
| 4,943,786 | 7/1990 | Cordwell et al. | 331/1 A |
| 5,027,087 | 6/1991 | Rottinghaus | 331/25 X |

*Primary Examiner*—David Mis

[57] ABSTRACT

A fast-switching frequency synthesizer utilizes a time-varying presteering voltage injection at the voltage controlled oscillator ("VCO") with feedback to allow the VCO and synthesizer to rapidly change between two given frequencies.

20 Claims, 5 Drawing Sheets

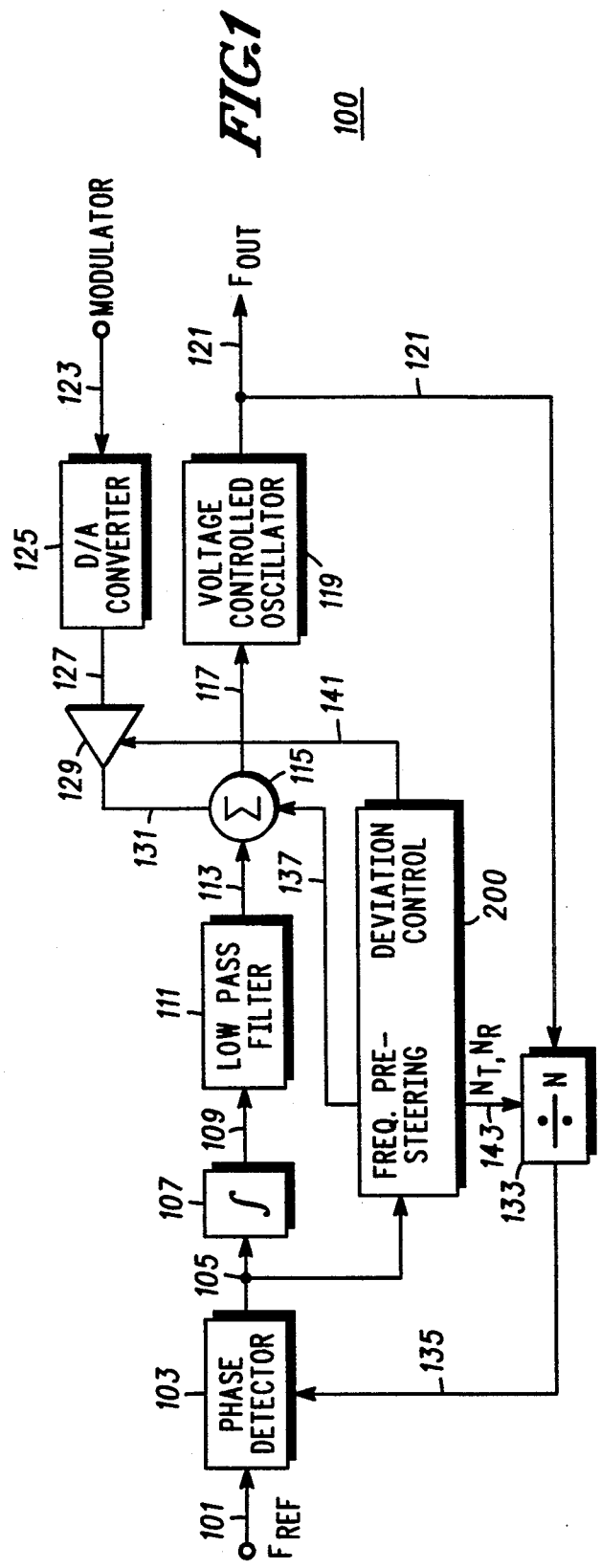
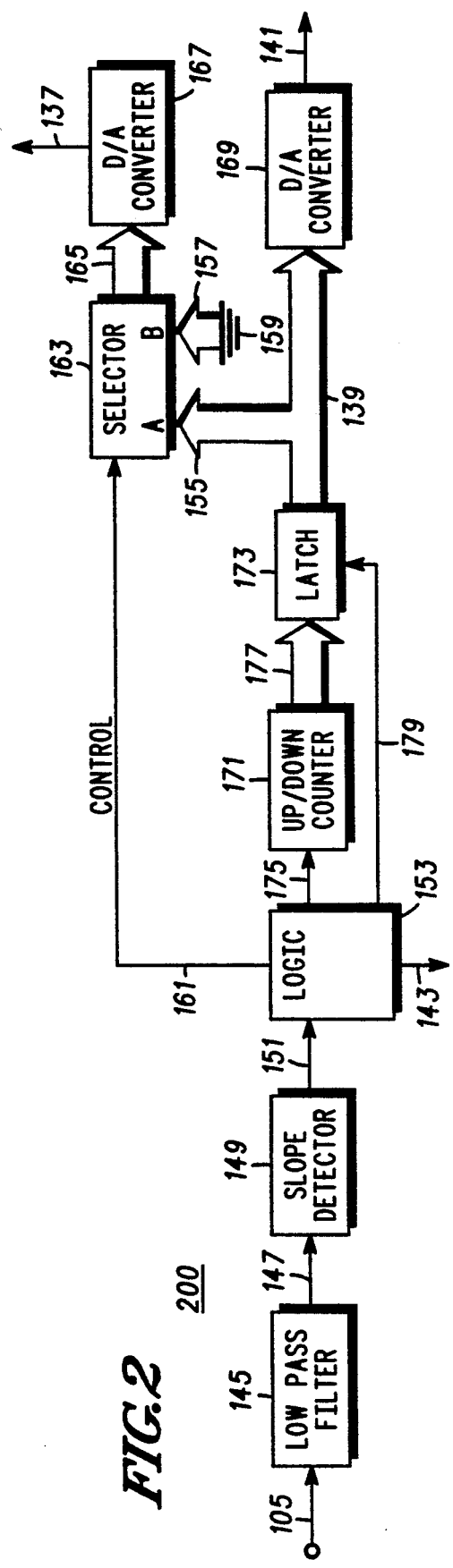

FAST-SWITCHING FREQUENCY SYNTHESIZER

CROSS-REFERENCE TO RELATED APPLICATION

This is a continuation-in-part of prior application Ser. No. 07/648,705, filed Jan. 31, 1991, now abandoned by Alan Patrick Rottinghaus, the same inventor of the present application, which prior application is assigned to Motorola, Inc., the same assignee as the present application, and which prior application is hereby incorporated by reference verbatim, with the same effect as though the prior application were fully and completely set forth herein.

TECHNICAL FIELD

This application relates to frequency synthesizers including, but not limited to, fast-switching frequency synthesizers.

BACKGROUND OF THE INVENTION

It is common to use a single frequency synthesizer in an FM radio to generate both the transmit frequency source and the receive local oscillator ("LO") for down-conversion. This type of synthesizer is typical in applications where a device receives and transmits on the same channel at different points in time. A significant problem in this type of application is getting the synthesizer to switch between the transmit frequency and the receive LO frequency as quickly as possible. The time the synthesizer takes getting between these two frequencies is literally wasted by the radio since it can neither transmit or receive during this time period.

Some past approaches to reducing this switching time have included, for example, parameter optimization and adaptive filtering. Each of these approaches, however, has limitations. A problem with parameter optimization has been that it requires modifying the closed-loop bandwidth. A problem with adaptive filtering has been transients and loop response optimization.

As a result, there is a need for an improved fast-switching frequency synthesizer.

SUMMARY OF THE INVENTION

Therefore, an improved fast-switching frequency synthesizer is provided. In a first embodiment of the invention, the synthesizer utilizes presteering voltage injection at the voltage controlled oscillator ("VCO") to cause the frequency to change rapidly. Also, feedback is added to the presteering network to maintain an accurate presteering voltage as the gain of the VCO varies from unit to unit drifts with temperature and age. The improved fast-switching frequency synthesizer, in accordance with the present invention, also uses the presteering voltage value to control the transmitter deviation, thereby eliminating the need for manual alignment.

In a second embodiment of the invention, the synthesizer uses a presteering time-varying voltage injection at the VCO to cause the frequency to change rapidly. Accordingly, a synthesizer for generating a frequency is provided, comprising:

a voltage controlled oscillator ("VCO") having a voltage control line and an output, a phase detector having a frequency reference, an input and an output, a frequency divider having an input and an output, the VCO output coupled to the frequency divider input, the frequency divider output coupled to the phase detector input, the phase detector output coupled to the voltage control line, and means for controlling the synthesizer frequency, comprising:

changing means for changing the frequency divider to a first divisor value;

injecting means for injecting a first waveform to the voltage control line at a fixed time with respect to changing the first divisor value;

sampling means for detecting and sampling the phase detector output responsive to changing to the first divisor value thereby forming a first sample signal;

adjusting means for adjusting the first waveform based on the first sample signal.

BRIEF DESCRIPTION OF THE DRAWINGS

FIG. 1 is a block diagram that shows a first embodiment of an improved fast-switching frequency synthesizer 100, in accordance with the present invention.

FIG. 2 shows the frequency pre-steering and deviation control circuit 200 of the first embodiment.

DETAILED DESCRIPTION

Figure 3:
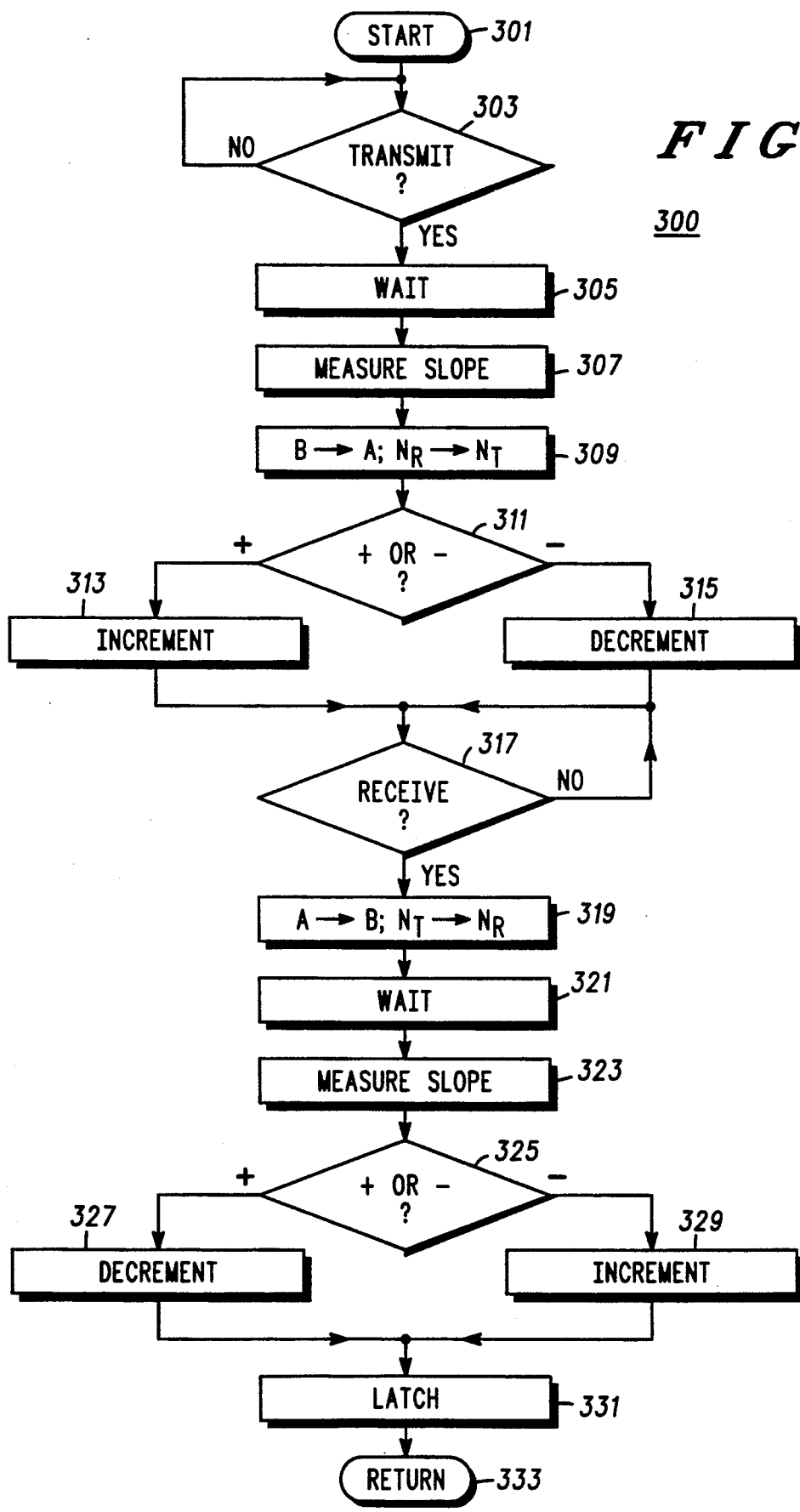
FIG. 3 shows a flow diagram 300 for the first embodiment.

FIG. 1 is a block diagram that shows a first embodiment of an improved fast-switching frequency synthesizer 100, in accordance with the present invention. As shown, the synthesizer is arranged with a frequency pre-steering and deviation control circuit 200. The synthesizer has two inputs—a reference frequency signal 101 ($f_{ref}$) and a digital baseband modulator signal 123.

As shown, the frequency reference signal 101 is input to the phase/frequency detector 103 where it is compared to the divided-down VCO output frequency 135. An output error signal 105 of the phase detector 103 is next applied to integrator 107. This integrator 107 is a typical integrator unit with a response in the S-plane of $(s+a)/Ks$.

The integrator output 109 is next applied to the low pass filter 111. This filter may be, for example, a typical 3-pole design with a bandwidth at least one order of magnitude greater than the natural frequency of the closed loop transfer function and at least one octave (preferably one decade) in frequency less than $f_{ref}(101)$.

As shown, the digital baseband modulator signal 123 is input to the digital to analog ("D/A") converter 125 to provide an analog baseband modulator signal 127. This signal is then level-adjusted by a variable gain device 129 to set the FM deviation. The gain of device 129 is adjusted by by level control line 141.

Returning now to low pass filter 111, the filter's output 113 is summed with the analog baseband modulator signal 131 and signal 137 by the summing amplifier 115. The summing amplifier's output 117 is then input to the control line of the voltage controlled oscillator (VCO) 119. The output of the VCO 119 is the transmitter RF frequency output signal 121. This signal is divided down to a frequency 135 equal to the frequency of $f_{ref}$ 101 by the divider 133's divisor (N). As shown, N is controlled by lead 143, and alternates between two values—$N_t$ corresponding to the transmit frequency and $N_r$ corresponding to the receive LO frequency.

As shown, the frequency presteering and deviation control circuit 200 switches the synthesizer 100 between the transmit frequency and the receive local oscillator (LO) frequency by changing the value of N via lead 143. As will be seen below, the circuit 200 also encourages the synthesizer's fast transition between states by simultaneously applying a voltage step signal of optimum amplitude to the VCO 119 via lead 137.

When the synthesizer goes to the transmit state, the frequency presteering and deviation control circuit 200 changes signal 143 from $N_r$ to $N_t$ simultaneously while injecting a positive-going voltage step signal at lead 137 to cause a corresponding change in voltage at the VCO input 117. As will be seen, the amplitude of this step signal has been determined to be the optimum value to change the VCO frequency from receive LO to transmit frequency. As a result, frequency changes at lead 135 are minimized and thus the error voltage 105 remains generally constant.

When the synthesizer goes to the receive state, the frequency presteering and deviation control circuit 200 changes signal 143 from $N_t$ to $N_r$ simultaneously as it changes the voltage at 137 from the above positive value back to zero. This negative-going voltage step at 137 causes a negative-going step at 117. As above, this voltage is substantially the voltage needed to change the VCO frequency from transmit frequency to receive LO frequency.

One problem with the pre-steering voltage arrangement is that the optimum value of step voltage change at the VCO input 117 to cause the frequency transition varies with temperature changes and unit variations. This is primarily due to variations in the voltage-versus-frequency characteristic of the VCO.

To solve this problem, the phase detector output signal 105 is used as an input to the frequency presteering and deviation control circuit 200 to provide feedback to keep the amplitude of the voltage step at lead 117 as close to the optimum value as possible. This is explained below.

Ideally, the phase detector 103's output signal 105 should be constant with zero slope at all times. In accordance with the present invention, circuit 200 incrementally increases or decreases the size of the voltage step 137 based on the slope of signal 105. This process is repeated each time the synthesizer switches from the transmit to the receive state. This adjustment continues until the slope of signal 105 is substantially zero and the step voltage 137 reaches its optimum value.

Moreover, the inventor has discovered the voltage step on signal 137 also gives a relative indication as to the slope variation in the VCO frequency-versus-voltage curve. Since the deviation of the FM transmitter also depends on the slope of this VCO curve, this indication may be used to adjust the relative FM deviation corresponding to that curve. In accordance with the present invention, the frequency presteering and deviation control circuit 200 uses level control signal 141 to control the variable gain device 129 in the baseband modulator path. Thus, when circuit 200 determines that the gain of the VCO has increased (or decreased), it decreases (or increases) the gain of device 129 via signal 141 to maintain a constant FM deviation.

Referring now to FIG. 2, there is shown the frequency pre-steering and control circuit 200. As shown, signal 105 is applied to a low pass filter 145. Filter 145 should have a bandwidth of at least twice that of the closed loop natural frequency of the synthesizer loop. The filter's output 147 is applied to slope detector 149. Slope detector 149 may be implemented, for example, by an A/D converter that samples two points in time and then compares them. Alternatively, detector 149 may be implemented by a comparator having signal 147 as a first input and a band-limited version of signal 147 as a second input. As shown, slope detector 149's output (151) is coupled to logic circuit 153.

As depicted, the logic circuit 153 receives the slope measurement information via signal 151.

The logic circuit 153 has four outputs—the divisor output signal 143, a selector control path 161, a latch control path 179, and an up/down counter control path 175.

The up/down counter output 177 is periodically transmitted to latch 173 under control of control path 179. As will be seen, the latch output bus 139 is used to generate both the level control signal 141 and the step voltage signal 137. The number of output bits in the up/down counter 171 should at least be the same as the number of bits on the latch output bus 139. Alternatively, the up/down counter 171 may have more bits than the bus 139 if the additional bits of the counter 171 are below the least significant bit of the bus 139. This configuration would effectively create a time constant in the counter 171 so that it would take more than one increment (or decrement) in a row to toggle the least significant bit of the bus 139. The process of incrementing, decrementing, and latching the up/down counter 171 will be discussed below.

As shown, the level control signal 141 is generated by applying the latch output bus 139 to the input of digital to analog converter 169. The output of converter 169 is the level control signal 141.

As shown, the step voltage signal 137 is generated by alternately switching selector 163 between it's "A" input 155 and it's "B" input 157. Latch output bus 139 is applied to the A input 155, while all zeroes—represented by the ground signal 159—is applied to the B input 157. The logic circuit 153 selectively toggles the selector 163 between the A and B inputs via control lead 161. The selector output 165 is applied to the input of digital to analog converter 167. The output of converter 167 is the step voltage signal 137.

FIG. 3 shows a flow diagram executed by the logic circuit 153. The process starts at step 301, and then goes to step 303. Here the process waits for a request for the synthesizer to go to the transmit state. When the synthesizer is ready to go to the transmit state, the process goes to step 305.

In step 305 selector control lead 161 switches the selector 163 output 165 from the ground signal 159 present on the B input (157) to the latch output bus signal 139 present on the A input (155), thereby injecting the presteering voltage step signal via step voltage output 137. Also in this step, divisor output lead 143 switches divider 133 from the $N_r$ divisor to the $N_t$ divisor. As a result of these actions, the synthesizer switches from the receive LO frequency to the transmit frequency.

The process next goes to wait step 307. The process waits here for a time period approximately 2 times the time constant of the synthesizer's closed loop transfer function. The time delay here allows the phase detector 103 to possibly generate an error signal in the event the step voltage level 137 is not at it's optimum value.

The process next goes step 309 where the slope measure of phase detector output 105 is taken from signal line 151.

The process next goes to decision step 311 where it determines whether the slope measurement of phase detector output 105 is positive or negative. If the slope is positive, the process goes to step 313, where it increments (steps up) the up/down counter 171. If the slope is negative, the process goes to step 315, where it decrements (steps down) the counter 171.

The process next goes to step 317 where it waits for a request for the synthesizer to go to the receive state. When the synthesizer is ready to go to the receive state, the process goes to step 319.

In step 319 selector control lead 161 switches the selector 163 output 165 from the latch output bus signal 139 present on the A input (155) to the ground signal 159 present on the B input (157), thereby removing the presteering voltage step signal via step voltage output 137. Also in this step, divisor output lead 143 switches divider 133 from the $N_t$ divisor to the $N_r$ divisor. As a result of these actions, the synthesizer switches from the transmit frequency to the receive LO frequency.

The process next goes to step 321, which is a wait step functionally equivalent to that of step 307 (see above).

The process next goes to step 323, which is a slope measurement step functionally equivalent to that of step 309 (see above).

The process next goes to decision step 325 where it determines whether the slope measurement of phase detector output 105 is positive or negative. If the slope is positive, the process goes to step 327, where it decrements the up/down counter 171. If the slope is positive, the process goes to step 329, where it increments the counter 171.

The process next goes to step 331. This step 331 latches the up/down counter output 177 onto bus 139. The process now returns (step 333) to step 301.

Those skilled in the art will appreciate that logic unit 153 may be implemented, for example, by a suitably-programmed microprocessor together with necessary logic circuitry and units. Also, it will be apparent to those skilled in the art that the up/down counter 171 may be incremented and/or decremented by any convenient predetermined value such as, for instance, by the value 1.

As mentioned above, a significant problem in radio manufacturing today is the effort required to calibrate the transmitter deviation. Manual techniques are especially undesirable here since they both reduce reliability and increase cost.

The present invention is particularly beneficial in this area since it allows the transmitter deviation to be adjusted and maintained automatically, thereby eliminating manual alignment during production, while adding only a small amount of extra circuitry. In fact, the overall cost of such units might even be reduced somewhat since the automatic adjustment feature allows components with more coarse and/or less precise tolerances to be used in production. Moreover, as discussed above, the invention also helps to guarantee that the alignment will readjust itself to the optimum value during the lifetime of the finished unit, by automatically compensating for the effects of heat and aging. As a result, the unit's over-all reliability and useful life-span have also been significantly increased.

Still another benefit of the present invention is it also corrects for variations in deviation that might be caused by channel changes due to VCO gain changes for varying and differing channels.

Another benefit of the invention, of course, is that it enables a radio transceiver using such a synthesizer to switch from a transmit to a receive state in the minimum time. This quick switching—or "turnaround"—time from transmit to receive could be very beneficial, for example, in a data application where a host computer is polling a large number of data terminals in a round-robin pattern via a common radio link. The switching time of each radio-terminal would be critical here since each terminal must normally reside in the receive mode to determine when it is being polled—or "addressed"—by the host. Once a terminal is polled, it must then switch to the transmit mode before it can transmit its data to the host. As a result, the time required for the host to poll all the terminals on the radio link will be limited by the mathematical sum of the individual switching times for all the terminals. Thus, for a large number of terminals, even a relatively small decrease in the transceiver switching time of each radio could result in a substantial increase in efficiency and data through-put for the host computer.

As disclosed above in describing the first embodiment of the invention, one technique for making a synthesizer switch quickly from one frequency to another is the use of presteering injection. This technique allows a synthesizer to switch quickly between its transmit and receive local oscillator ("LO") frequency by injecting a presteering step at the voltage controlled oscillator ("VCO") input that is equal to the voltage needed to (within the resolution of the D/A converter 167) make the frequency transition. This voltage step is suppose to be injected at exactly the same time the divide-by-ratio in the synthesizer loop changes. If the presteering step is exactly the correct size and the step is injected exactly coincident with the change in divide ratio, the error voltage 105 out of the phase detector 103 before and after the frequency transition should be equal to zero. Any error out of the phase detector 103, following the transition in frequency, can be used as feedback to determine if the size of the presteering step should be made larger or smaller.

The above-described first embodiment is the subject of patent application Ser. No. 07/474,969, filed Feb. 2, 1990, entitled "Fast-Switching Frequency Synthesizer," by Alan Patrick Rottinghaus, inventor of the present invention, which patent application is assigned to Motorola, Inc., and which patent application issued on Jun. 25, 1991 as U.S. Pat. No. 5,027,087.

Although the presteering injection synthesizer described above as the first embodiment of the invention and depicted in FIGS. 1-3 is satisfactory, it has several short comings. First, a step in voltage at the input 117 to the VCO 119 does not necessarily produce a step in frequency at the VCO output 121. The "transfer function" of the VCO 119 may not be perfect. Things like post tuning drift caused by varactor relaxation can result in transients.

Second, it is impossible to exactly align in time, the injection of the presteering step, and the change in the synthesizer's divide ratio. The first and second scenario listed above cause similar problems. They both result in a frequency error for a short period at the phase detector input 135. This, in turn, results in an error at the phase detector output 105 following the frequency transition. This error at the phase detector output 105 following a frequency transition will therefore occur even if the size of the presteering step is exactly correct. This error by itself would not be a problem; but, as is known, an error at the phase detector output 105 cannot last forever in most types of loops. The phase locked loop ("PLL") will track this error out. That is, even if the transients have decayed to zero, the net resulting error at the phase detector 103 will cause the PLL to react. This means that even though the VCO 119 may be exactly on frequency some short time after the presteering step, the PLL will pull the VCO 119 off frequency to cancel out the error at the phase detector output 105.

The solution described hereinbelow and depicted in FIGS. 4-5 as "the second embodiment" allows the cancellation of time-varying transient frequency errors during a presteering step. It does this through the use of a finite impulse response ("FIR") filter structure. The resulting second embodiment synthesizer comes much closer to having zero error out of the phase detector 103 before and after the frequency transition. Currently this technique is implemented in products achieving a turnaround time, that is, from transmit to receive frequency (or visa versa), of 35 microseconds.

Figure 4:
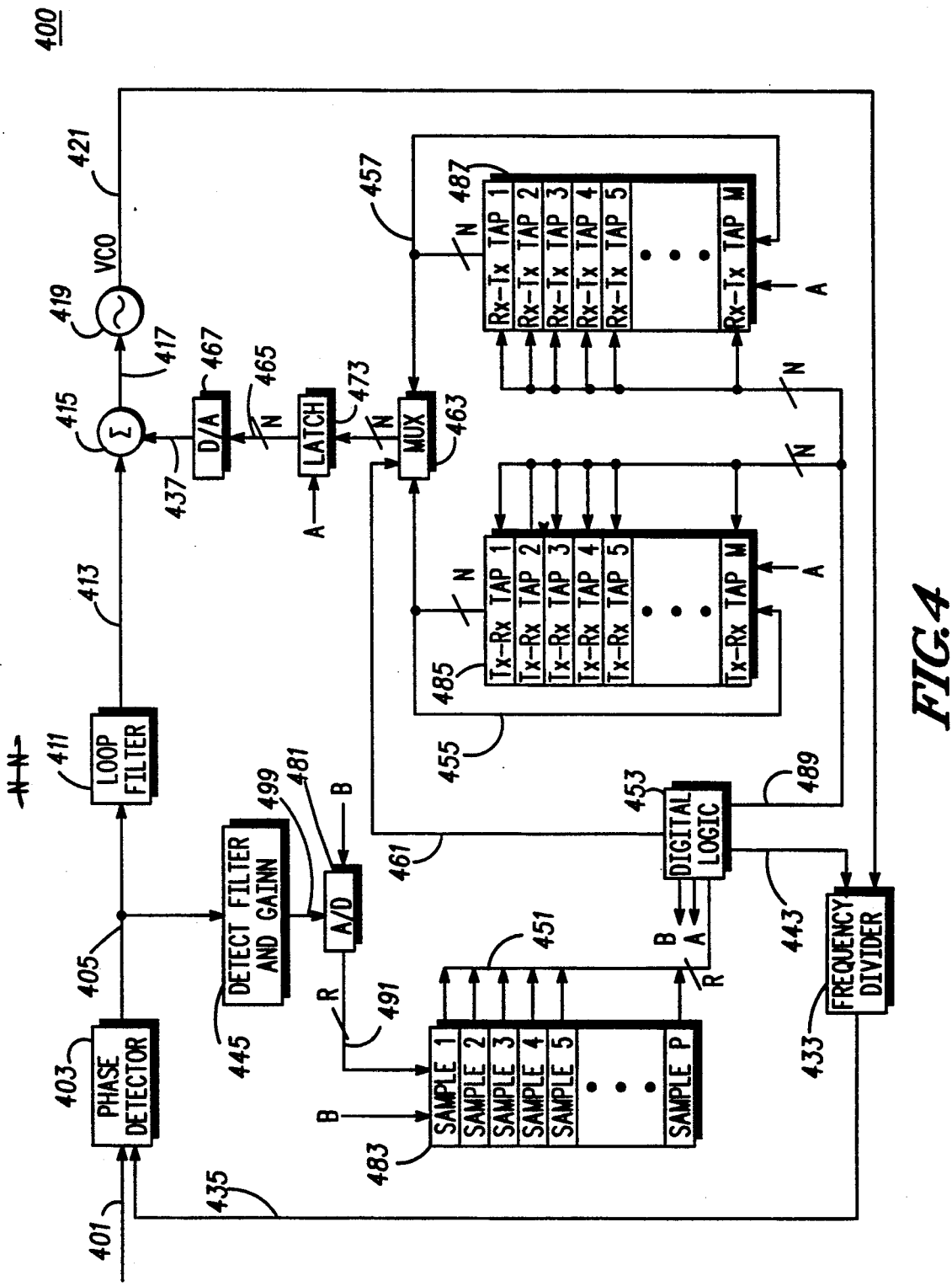
FIG. 4 shows a second embodiment of an improved fast-switching frequency synthesizer 400, in accordance with the present invention.
Figure 5:
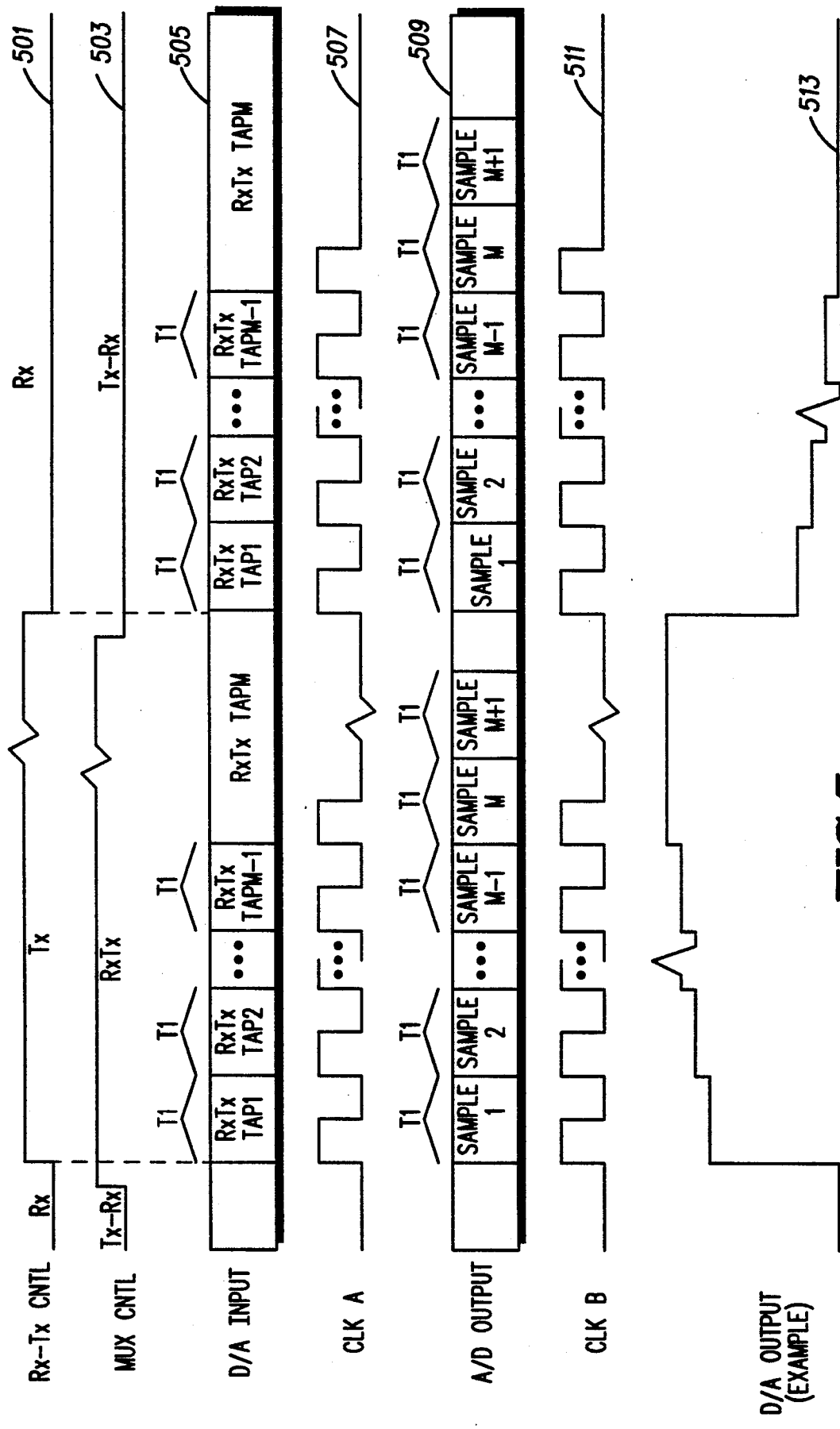
FIG. 5 depicts waveforms for the second embodiment.

Accordingly, the second embodiment of FIGS. 4-5 can be described as a presteering injection synthesizer with transient cancellation.

Referring now to FIG. 4, around the periphery of FIG. 4 is the conventional synthesizer (compare to the first embodiment, FIG. 1). Note the VCO 419 (compare to element 119 in FIG. 1), the frequency divider 433 (compare to element 133 in FIG. 1), the phase detector 403 (compare to element 103 in FIG. 1), and the loop filter 411 (compare to element 111 in FIG. 1). The loop filter output 413 (compare to element 113 in FIG. 1) drives a summing device 415 (compare to element 115 in FIG. 1), which drives the VCO 419. The second input 437 (compare to element 137 in FIG. 1) is the presteering voltage which is created by digital-to-analog ("D/A") converter 467 (compare to element 167 in FIG. 2). Note that the D/A unit 467 is driven by latch 473. The latch 473 is driven by multiplexer unit 463 (compare to element 163 in FIG. 2), which has a first input 455 (compare to element 155 in FIG. 2), a second input 457 (compare to element 157 in FIG. 2), and a control line 461 (compare to element 161 in FIG. 2). Timing and control is provided by digital logic 453 (compare to element 153 in FIG. 2). Those skilled in the art will appreciate that logic unit 453 may include a suitably-programmed microprocessor such as, for example, the Motorola Part/No. 68HC11E9 together with necessary logic circuitry and units. Note that digital logic 453 provides a first clock signal designated "A" and a second clock signal designated "B".

The presteering step 437 is created from the impulse response of an FIR filter comprising the two shift registers (N×M in size) designated 485 and 487. Each register 485 and 487 outputs a different FIR filter impulse response; register 485 via output 455, and register 487 via output 457. The shift register 487 includes M taps designated Rx-Tx Tap 1 through Rx-Tx Tap M and is used on a transition from the receive LO frequency to the transmit frequency. The shift register 485 includes M taps designated Tx-Rx Tap 1 through Tx-Rx Tap M and is used on a transition from the transmit frequency to the receive LO frequency.

When a request to change from the receive LO frequency to the transmit frequency is given, the digital logic 453 will change the frequency divider 433 via control lead 443. Refer to FIG. 5, waveform designated "Rx-Tx Cntl", element 501. At that same instant, clock A starts (refer to FIG. 5, element 507) and the D/A unit 467 input signal 465 (refer to FIG. 5, element 505) changes from Tx-Rx Tap M to Rx-Tx Tap 1. This first tap creates the largest portion of the presteering step in most situations. On a regular interval (approximately 10 microseconds or less), a new Rx-Tx Tap will be shifted out to the D/A input 465. This effectively creates a transient waveform at the D/A output 437 (refer to FIG. 5, element 513) and the VCO input 417. When Rx-Tx Tap M is finally shifted to the D/A input 465, clock A stops, thus leaving the D/A output 437 fixed during the remainder of the transmit frequency cycle. Referring to FIG. 5, element 503, note that the MUX unit 463 control lead 461 is HIGH during this interval.

When a request to change from the transmit frequency to the receive LO frequency is given, the digital logic 453 changes the frequency divider 433 via lead 443. At the same instant clock A starts again and the D/A input 465 changes from Rx-Tx Tap M to Tx-Rx Tap 1. This first tap creates the largest portion of the presteering step in most situations. On a regular interval, a new Tx-Rx Tap is shifted out to the D/A input 465. When Tx-Rx Tap M is finally shifted to the input 465 of D/A 467, clock A stops, thus leaving the D/A output 437 fixed during the remainder of the receive LO frequency cycle. Referring to FIG. 5, element 503, note that the MUX unit 463 control lead 461 is LOW during this interval.

As can be seen from FIG. 4, a separate FIR filter response is provided for the creation of transient presteering steps for each of the two respective transitions. Therefore, register 485 provides the presteering time-varying waveform via output 455 for the transmit-to-receive transition, while register 487 provides the presteering time-varying waveform via output 457 for the receive-to-transmit transition. This is important since characteristics like post tuning drift are not necessarily the same on each transition. It should be noted that the structure of the two FIR filters (485 and 487), in different shift registers with the MUX 463, is not the only implementation of this concept. For example, a single shift register with both the Tx to Rx taps and Rx to Tx taps may also be used.

Each of the tap values is loaded by digital logic 453 and calculated by an algorithm resident therein. The processor algorithm uses as its input a discrete time representation of the error voltage 405 coming out of the phase detector 403. As seen in elements 509 and 511 of FIG. 5, the A/D converter 481 samples the filtered and amplified phase detector error voltage 405 on a frequency transition synchronous with the shifting of the FIR taps. Each A/D sample is shifted into register 483 to be read later by the processor through the digital logic 453. It will be appreciated that the A/D samples do not necessarily have to be synchronized with the tap shifting but could be placed at any predetermined point in time with respect to the transition in frequency. In the current product, samples are taken both with every tap shift and at fixed points in time after the frequency transition, after the M taps have been shifted.

The software in the processor, which is part of the digital logic 453, contains the algorithm that is used to calculate the FIR taps from the A/D samples. There are many different algorithms which could perform this FIR tap calculation in an adaptive manner. Two preferred embodiments are given herein.

Figure 6:
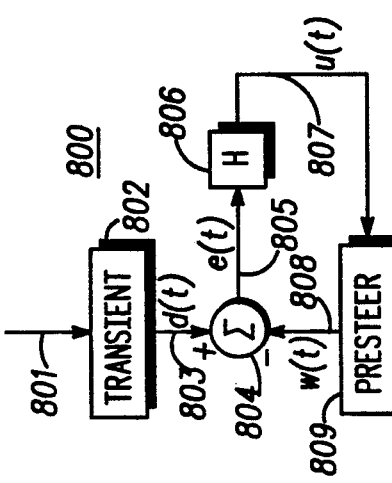
FIG. 6 is a theoretical model for the VCO of the second embodiment.

The first embodiment is a mathematical derivation that minimizes the mean square error signal 405. This embodiment is a general algorithm for M taps as is shown in blocks 485 and 487. This algorithm assumes that the VCO (419) and the transient errors such as post tuning drift can be modeled as is shown in FIG. 6. In this figure signal 606 is the drift can be modeled as is shown in FIG. 6. In this FIG. signal 606 is the same as signal 417 and signal 605 is the same as signal 421. The ideal VCO is shown as 601 while the non-ideal portion of the frequency transition such as post tuning drift and noise are generated by block 602. The output of this block is signal 607 which is the transient and noise. The transient (non-noise component) of signal 607 is zero in steady state. The transient output from 602 occurs when triggered by signal 608. It should be noted that the transient is different for a Tx to Rx VCO transition than it is for an Rx to Tx transition. Signal 608 is the same as signal 443. Any state change in signal 608 will trigger 602. Signal 607 is summed with signal 606 by summer 603 whose output is signal 604. Signal 604 is the input to the ideal VCO.

Figure 7:
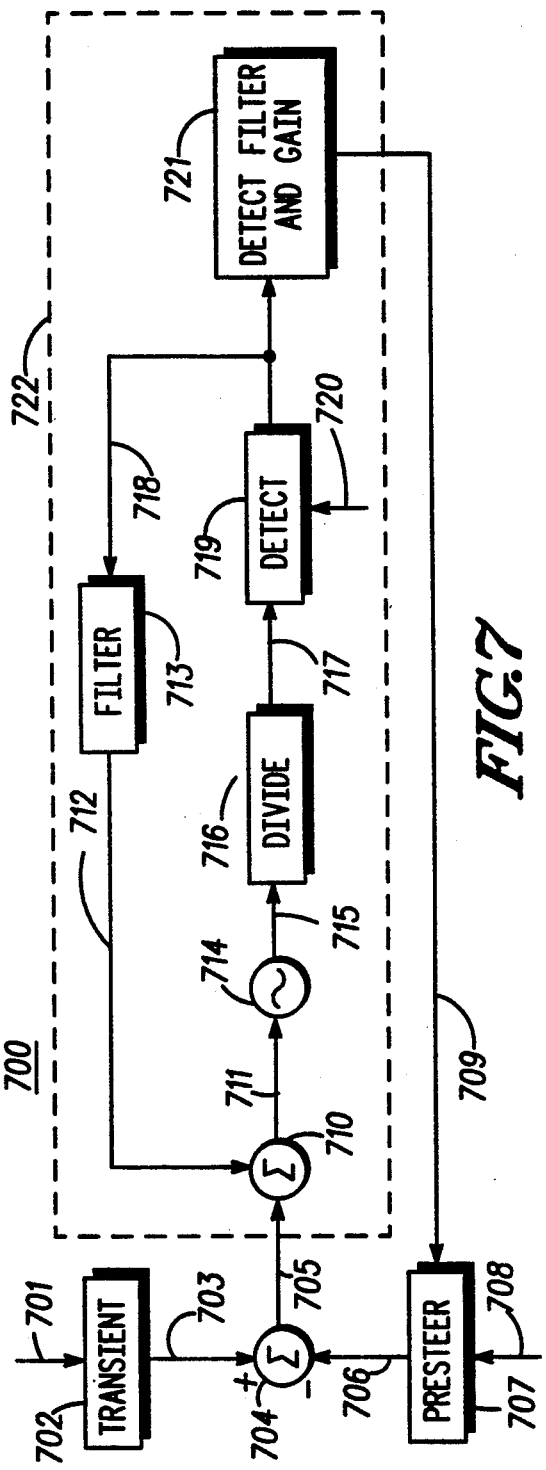

Using this model (shown in FIG. 6), FIG. 4 can be redrawn as is shown in FIG. 7. In this diagram note the ideal VCO 714 (compare to element 601 in FIG. 6), the frequency divider 716 (compare to element 433 in FIG. 4), the phase detector 719 (compare to element 403), the loop filter 713 (compare to element 411), the detect filter and gain 721 (compare to element 445) and the triggered transient 702 (compare to element 602). The input to the triggered transient is signal 701 (compare to signal 606). The two summers 704 and 710 are equivalent to summer 415 and summer 603 with the order of signal summation changed to allow a mathematical examination of signal 705. Signal 706 can be equated to signal 437 in FIG. 4 while signal 709 can be equated to signal 499. The adaptive presteerer 707 comprises all of the circuitry and processing required to use the input 709 to generate the output 707. The other input to 707 is signal 708. This signal is an impulse that occurs coincident in time with every state change of signal 701.

Figure 8:
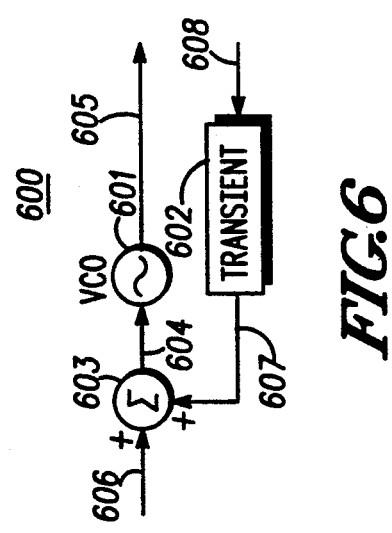
FIGS. 7–8 are modified versions of FIG. 4.

FIG. 7 can be redrawn once again if it is assumed that everything in the dashed box 722 can be described by a single transfer function; see FIG. 8. Note the summer 804 (compare to element 704), the adaptive presteerer 809 (compare to element 707), the triggered transient 802 (compare to element 702) and the transfer function H denoted as 806 (compare to the elements in dashed box 722).

In FIG. 8 the purpose of the adaptive presteerer 802 is to provide FIR taps that when stimulated by impulse 810 will create a transient waveform signal 808. Ideally signal 808 when summed with signal 803 (the triggered transient), will result in signal 805 being equal to zero. The purpose of the algorithm is therefore to minimize signal 805 or e(t).

The impulse response of block 806 can be sampled where the samples are elements of matrix H. (In reality, this impulse response is derived from known networks in the PLL, expressed in S domain parameters, using textbook techniques such as impulse invariance.) Matrix H is equivalently an FIR filter representation of block 806 expressed as an N×N lower triangular matrix.

$$H = \begin{bmatrix} h(0) & 0 & \ldots & 0 \\ h(1) & h(0) & \ldots & 0 \\ \cdot & \cdot & & \cdot \\ \cdot & \cdot & & \cdot \\ \cdot & \cdot & & \cdot \\ h(N-1) & h(N-2) & \ldots & h(0) \end{bmatrix}$$ Eq. 1

Signal u(t), w(t), d(t) and e(t) can all be represented by column vectors U, W, D and E where those vectors are discrete time samples of their respective signals. The relationship between U and E can be written as below:

$$U = H E$$ Eq. 2

The algorithm used will try to force e(t) to zero by minimizing the mean square error of E through the modification of W. In order for the algorithm to minimize e(t) it must have access to it. The input to the processor, and therefore the algorithm, is U. It must be shown that minimizing the mean square error of U is the same as minimizing the mean square error of E. Since U has a significant noise component, the analysis will use an ensemble average of U. Below is the ensemble average of the mean square error of U as it is related to E through the use of equation 2.

$$<U'U> = <E'H'HE>$$ Eq. 3

Equation 3 can be rewritten by expressing E as a function of D and W as seen below:

$$<U'U> = <(D-W)'H'H(D-W)>.$$ Eq. 4

Equation 4 can be expanded and rewritten moving certain nonrandom terms out of the ensemble average.

$$<U'U> = <D'H'HD> + W'H'HW - 2W'H'H<D>$$ Eq. 5

It will be assumed that H is a positive definite, or semi-definite, matrix and therefore the gradient of the mean square error of U will have one minimum.

$$\nabla_w <U'U> = 0 + 2H'HW - 2H'H<D>.$$ Eq. 6

Setting the gradient of the mean square error of U to zero allows a direct solution of W to be found at the minimum (of the gradient).

$$W = <D>$$ Eq. 7

The solution shows that minimizing the mean square error of U will allow W to be equal to the ensemble average of D (the transient plus noise).

Since the block diagram in FIG. 8 is a feedback control system and the signal d(t) will vary slowly with time; it will obviously not be desirable to find a direct solution for W by observing U; instead, the correct approach is to use the gradient of the mean square error of U to point in the direction of the steepest "descent" toward the minimum of the gradient. Equation 8 expresses the vector W in an interactive manner where k is a very small constant number.

$$W_{n+1} = W_n + k \nabla_w <U'U>$$ Eq. 8

If k is a sufficiently small number, than it is also not necessary to use the ensemble average of the mean square error since on the average the value added to $W_n$ will move the vector in the correct direction. Given this fact and using equation 6 with out the ensemble averages, vector $W_{n+1}$ can be written in terms of signals or vectors that are accessible or known by the algorithm.

$$W_{n+1} = W_n + 2kH^TU_m \qquad \text{Eq. 9}$$

The above equation is the algorithm that can be used by the processor in block 809 of FIG. 8 to iteratively calculate the value of the presteering waveform w(t) (signal 808). Vectors U are sampled corresponding respectively to each different synthesizer transition (Tx to Rx or Rx to Tx). The matrix H and the scaler k are the same for each transition. In this way a separate vector W can be updated for each respective frequency transition.

The second embodiment of the algorithm implemented in the processor which is contained in block 453 of FIG. 4 is experimentally determined. This algorithm is used in the current ship product and assumes that M is equal to 2 in blocks 485 and blocks 487. That is, since the hardware in the manufactured product has 10 taps for each respective frequency transition, taps 2 through 10 are the same for each respective transition.

This algorithm uses 10 FIR taps per frequency transition, $TXRX_1$ through $TXRX_{10}$ for the transmit to receive LO frequency transition (Tx to Rx) and $RXTX_1$ through $RXTX_{10}$ for the opposite transition (Rx to Tx). The first tap can be related to the remaining taps by the following equations.

$$RXTX_1 = RXTX_2 + TXRX\_CON \qquad \text{Eq. 10}$$

$$TXRX_1 = TXRX_2 + TXRX\_CON \qquad \text{Eq. 11}$$

There are 12 A/D samples per frequency transition called $u_{rt}(0)$ through $u_{tr}(11)$ for the Rx to Tx transition and $u_{tr}(0)$ through $u_{tr}(11)$ for the Tx to Rx transition. Sample u(0) occurs just before the first tap shift. Sample u(1) through u(10) occur coincident with each of the 10 taps. Sample u(11) occurs at time $T_{11}$ where $T_{11}$ is the time between the first tap shift and the sample u(11).

Assuming a second order critically damped closed loop transfer function for the PLL; the time constant of each of the two real poles is $T_{PLL}$. The sample time of u(11) is $T_{11}$ which is typically greater than 1.5 times $T_{PLL}$ and less than 5 times $T_{PLL}$. (The value used in the manufactured product is 2.1 times $T_{PLL}$.)

The tap spacing should be chosen so that each tap is a significant fraction of the time constant of the detect filter $T_{DET}$. Typical tap durations are greater than 0.4 time $T_{DET}$ and less then 3 times $T_{DET}$. (The value used in the ship product is 0.5 times $T_{DET}$ where $T_{DET}$ is approximately ⅓ of $T_{PLL}$.)

Taps $TXRX_2$ through $TXRX_{10}$ are always considered to be constant at 2% of the D/As dynamic range (see D/A 467 FIG. 4).

Taps $RXTX_2$ through $TXRX_{10}$ are given an initial value of % of D/A 467's dynamic range and TXRX_CON and RXTX_CON are initialized to zero.

The algorithm has two phases, the first phase all ten TXRX taps are the same and all ten RXTX taps are the same. Additionally, all of the TXRX taps are fixed at 2% of the D/A dynamic range. When this first phase has converged then the second phase starts. Convergence is detected by monitoring the adjustments to the RXTX taps. If all the decisions are in the same direction (increment or decrement) then the algorithm has not converged. If the decisions are, on the average, equal amounts in both directions, then the first phase of the algorithm has converged. The second phase of the algorithm allows the taps $RXTX_1$ and $TXRX_1$ to be different than $RXTX_2$ through $RXTX_{10}$ and $TXRX_2$ through $TXRX_{10}$ respectively.

The first phase of the algorithm before convergence is as follows. On a Rx to Tx transition, if sample $u_{rt}(11)$ is greater then $u_{rt}(0)$ then $RXTX_1$ through $RXTX_{10}$ are incremented by some small amount, else they are decremented. On a TX to Rx transition, if sample $u_{tr}(11)$ is greater than $u_{tr}(0)$ then $RXTX_1$ through $RXTX_{10}$ are decremented by some small amount, else they are incremented.

The second phase of the algorithm starts after convergence of the first. On a TX to Rx transition, if sample $u_{tr}(11)$ is greater than $u_{tr}(0)$ then $RXTX_2$ through $RXTX_{10}$ are decremented by some small amount, else they are incremented. The samples $u_{tr}(0)$ through $u_{tr}(11)$ are taken and each is averaged with corresponding samples from previous Tx to Rx transitions. Every N Tx to Rx transitions, the averaged samples, $u_{atr}(0)$ through $u_{atr}(11)$, are taken and TXRX_CON is updated from them. TXRX_CON is updated, $u_{atr}(0)$ through $u_{atr}(11)$ are cleared and the averaging starts over for the following N Tx to Rx transitions.

TXRX_CON is calculated form the following algorithm.

---

IF $u_{atr}(5) - u_{atr}(0) > 0$
  THEN find the maximum sample $u_{atr}(0)$ through $u_{atr}(11)$
    IF $u_{atr}(11)$-(maximum sample) < 0
      THEN increment TXRX_CON by a small amount
    ELSE leave TXRX_CON as it was
    ENDIF
ELSE IF $u_{atr}(5) - u_{atr}(0) < 0$
  THEN find the minimum sample $u_{atr}(0)$ through $u_{atr}(11)$
    IF $u_{atr}(11)$-(minimum sample) > 0
      THEN decrement TXRX_CON by a small amount
    ELSE leave TXRX_CON as is was
    ENDIF
ENDIF

---

During the second phase of the algorithm, on a Rx to Tx transition, if sample $u_{rt}(11)$ is greater than $u_{rt}(0)$ then $RXTX_2$ through $RXTX_{10}$ are incremented by some small amount, else they are decremented. The samples $u_{rt}(0)$ through $u_{rt}(11)$ are taken and each is averaged with corresponding samples from previous Tx to Rx transitions. Every N Rx to Tx transitions, the averaged samples, $u_{art}(0)$ through $u_{art}(11)$, are taken and RXTX_CON is updated from them. After RXTX_CON is updated, $u_{art}(0)$ through $u_{art}(11)$ are cleared and the averaging starts over for the following N Rx to Tx transitions.

RXTX_CON is calculated form the following algorithm.

---

IF $u_{art}(5) - u_{art}(0) > 0$
  THEN find the maximum sample $u_{art}(0)$ through $u_{art}(11)$
    IF $u_{art}(11)$-(maximum sample) < 0
      THEN increment RXTX_CON by a small amount
    ELSE leave RXTX_CON as it was
    ENDIF
ELSE IF $u_{art}(5) - u_{art}(0) < 0$
  THEN find the minimum sample $u_{art}(0)$ through $u_{art}(11)$ -continued

```
IF u_arr(11)-(minimum sample) > 0
   THEN decrement RXTX_CON by a small amount
   ELSE leave RXTX_CON as it was
   ENDIF
ENDIF
```

The above algorithm can be used by the processor in block 809 of FIG. 8 to iteratively calculate the value of the presteering waveform w(t) (signal 808). This 2 tap FIR algorithm performs adequately for the production application since the transient associated with the VCO presteering are short in duration and do not need a long transient to be generated to cancel them.

The end result of either of the two algorithm embodiments is that the digital logic 453 can recalculate the FIR tap values based on the processed error signal 405 coming out of the phase detector 403. This circuit can effectively be thought of as a dual adaptive FIR filter used for presteering a synthesizer. The resulting presteering waveform (element 513 of FIG. 5), or equivalent waveform, quickly and accurately gets the VCO 419 to the new frequency and cancels out undesirable transient responses in the VCO and parasitic responses in the loop (such as the misalignment of the change in frequency divide ratio with the presteering tap).

While various embodiments of a fast-switching frequency synthesizer, in accordance with the present invention, have been described hereinabove, the scope of the invention is defined by the following claims.

What is claimed is:

1. A synthesizer for generating a frequency, comprising:
   a voltage controlled oscillator ("VCO") having a voltage control line and an output,
   a phase detector having a frequency reference, an input and an output,
   a frequency divider having an input and an output,
   the VCO output coupled to the frequency divider input, the frequency divider output coupled to the phase detector input, the phase detector output coupled to the voltage control line, and
   means for controlling the synthesizer frequency, comprising:
   changing means for changing the frequency divider to a first divisor value;
   injecting means for injecting a first waveform to the voltage control line at a fixed time with respect to changing to the first divisor value;
   sampling means for detecting and sampling the phase detector output responsive to changing to the first divisor value thereby forming a first sample signal;
   adjusting means for adjusting the first waveform based on the first sample signal.

2. The synthesizer of claim 1 wherein the adjusting means includes means for adjusting the first waveform based on a first algorithm.

3. The synthesizer of claim 2 wherein the first waveform is based on the impulse response of a first finite impulse response ("FIR") filter comprising a first shift register having first tap values.

4. The synthesizer of claim 3 wherein the first waveform includes a plurality of transient presteering steps based on the first tap values.

5. The synthesizer of claim 4 wherein the adjusting means includes means for adjusting the first tap values based on the first sample signal.

6. The synthesizer of claim 1 wherein:
   the changing means further includes means for changing the frequency divider to a second divisor value;
   the injecting means further includes means for injecting a second waveform to the voltage control line at a fixed time with respect to changing to the second divisor value;
   the sampling means further includes means for detecting and sampling the phase detector output responsive to changing to the second divisor value thereby forming a second sample signal; and,
   the adjusting means further includes means for adjusting the second waveform based on the second sample signal.

7. The synthesizer of claim 6 wherein the adjusting means includes means for adjusting the second waveform based on a second algorithm.

8. The synthesizer of claim 7 wherein the second waveform is based on the impulse response of a second FIR filter comprising a second shift register having second tap values.

9. The synthesizer of claim 8 wherein the second waveform includes a plurality of transient presteering steps based on the second tap values.

10. The synthesizer of claim 9 wherein the adjusting means includes means for adjusting the second tap values based on the second sample signal.

11. In a synthesizer for generating a frequency, comprising:
    a voltage controlled oscillator ("VCO") having a voltage control line and an output,
    a phase detector having a frequency reference, an input and an output,
    a frequency divider having an input and an output,
    the VCO output coupled to the frequency divider input, the frequency divider output coupled to the phase detector input, the phase detector output coupled to the voltage control line, and
    a method for controlling the synthesizer frequency, comprising the steps of:
    (a) changing the frequency divider to a first divisor value;
    (b) injecting a first waveform to the voltage control line at a fixed time with respect to changing to the first divisor value;
    (c) detecting and sampling the phase detector output responsive to changing to the first divisor value thereby forming a first sample signal;
    (d) adjusting the first waveform based on the first sample signal.

12. The method of claim 11 wherein the adjusting step (d) includes a step of adjusting the first waveform based on a first algorithm.

13. The method of claim 12 wherein the first waveform is based on the impulse response of a first finite impulse response ("FIR") filter comprising a first shift register having first tap values.

14. The method of claim 13 wherein the first waveform includes a plurality of transient presteering steps based on the first tap values.

15. The method of claim 14 wherein the adjusting step (d) includes a step of adjusting the first tap values based on the first sample signal.

16. The method of claim 11 including the further steps of:
    (e) changing the frequency divider to a second divisor value;

(f) injecting a second waveform to the voltage control line at a fixed time with respect to changing to the second divisor value;
(g) detecting and sampling the phase detector output responsive to changing to the second divisor value thereby forming a second sample signal; and,
(h) adjusting the second waveform based on the second sample signal.

17. The method of claim 16 wherein the adjusting step (h) includes a step of adjusting the second waveform based on a second algorithm.

18. The method of claim 17 wherein the second waveform is based on the impulse response of a second FIR filter comprising a second shift register having second tap values.

19. The method of claim 18 wherein the second waveform includes a plurality of transient presteering steps based on the second tap values.

20. The method of claim 19 wherein the adjusting step (h) includes a step of adjusting the second tap values based on the second sample signal.

* * * * *